United States Patent
Forbes et al.

(10) Patent No.: US 6,297,521 B1
(45) Date of Patent: Oct. 2, 2001

(54) GRADED ANTI-REFLECTIVE COATING FOR IC LITHOGRAPHY

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/133,943

(22) Filed: Aug. 14, 1998

Related U.S. Application Data

(62) Division of application No. 08/958,023, filed on Oct. 27, 1997, now Pat. No. 5,926,740.

(51) Int. Cl.⁷ .................................................. H01L 31/0232
(52) U.S. Cl. ...................... 257/76; 257/77; 257/436; 257/437; 257/635; 257/637; 438/763; 438/781; 438/931; 438/952
(58) Field of Search ................................. 257/437, 436, 257/98, 635, 637, 77, 76; 438/763, 781, 931, 952

(56) References Cited

U.S. PATENT DOCUMENTS

| | | | |
|---|---|---|---|
| 4,528,418 * | 7/1985 | McGill | 136/256 |
| 4,647,472 * | 3/1987 | Hiraki et al. | 427/39 |
| 5,080,455 * | 1/1992 | King et al. | 359/350 |
| 5,525,542 * | 6/1996 | Maniar et al. | 437/186 |
| 5,674,356 * | 10/1997 | Nagayama | 156/659.11 |
| 5,831,321 * | 11/1998 | Nagayama | 257/412 |
| 5,926,740 * | 7/1999 | Forbes et al. | 438/763 |
| 5,986,318 * | 11/1999 | Kim et al. | 257/437 |
| 6,005,277 * | 12/1999 | Liu et al. | 257/437 |
| 6,043,547 * | 3/2000 | Hsia et al. | 257/437 |

\* cited by examiner

*Primary Examiner*—William Mintel
(74) *Attorney, Agent, or Firm*—Schwegman, Lundberg, Woessner & Kluth, P.A.

(57) ABSTRACT

A substantially continuously graded composition silicon oxycarbide (SiOC) antireflective coating (ARC) or antireflective layer (ARL) is interposed between a photoresist layer and an underlying substrate. The ARC matches an optical impedance at the interface between the ARC and photoresist. The optical impedance decreases (absorptivity increases) substantially continuously, in the ARC in a direction away from the interface between the ARC and the photoresist. The ARC composition is graded from SiOC, at its interface with the photoresist, to SiC or Si, in a direction away from the photoresist. Reflections at the ARC-photoresist interface are substantially eliminated. Substantially all incident light, including ultraviolet (UV) and deep ultraviolet (DUV) light, is absorbed in the ARC. As a result, substantially no light reaches or is reflected from the underlying substrate. Photolithographic limitations such as swing effect and reflective notching are reduced.

41 Claims, 1 Drawing Sheet

GRADED ANTI-REFLECTIVE COATING FOR IC LITHOGRAPHY

CROSS-REFERENCE TO RELATED APPLICATIONS

This application is a division of U.S. patent application Ser. No. 08/958,023, filed on Oct. 27, 1997, now U.S. Pat. No. 5,926,740 which is incorporated herein by reference.

TECHNICAL FIELD OF THE INVENTION

This invention relates generally to integrated circuits, and particularly, but not by way of limitation, to a graded silicon oxycarbide anti-reflective coating for integrated circuit photolithography.

BACKGROUND OF THE INVENTION

Trends in modern integrated circuit (IC) technology demand increasingly dense ICs, such as for computer systems, portable electronics, and telecommunications products. IC fabrication includes, among other things, photolithography for selective patterning and etching of photoresist layers. The patterned photoresist layer serves as a masking layer such that a subsequent IC processing step is carried out on only those portions of the underlying IC that are uncovered by photoresist, as described below.

A photoresist layer is typically formed on an underlying integrated circuit substrate. The photoresist layer overlays any structures that are already formed on the substrate. Portions of the photoresist are selectively exposed to light through a lithographic mask that includes clear and opaque portions forming a desired pattern. Light is transmitted through the clear portions of the mask, but not through the opaque portions. The incident light changes the chemical structure of the exposed portions of photoresist. A chemical etchant, which is sensitive to only one of the exposed and unexposed portions of the photoresist, is applied to the photoresist to selectively remove those portions of the photoresist to which the chemical etchant is sensitive. As a result, portions of the photoresist which are insensitive to the chemical etchant remain on the IC. The remaining portions of the photoresist protect corresponding underlying portions of the IC from a subsequent IC processing step. After this IC processing step, the remaining portions of the photoresist layer are typically removed from the IC.

High density ICs require sharply defined photoresist patterns, because these patterns are used to define the locations (and density) of structures formed on the IC. However, light reflects from the surface of the underlying substrate on which the photoresist is formed. Certain structures that are formed on the underlying substrate are highly reflective such as, for example, aluminum layers for forming circuit interconnections. Reflections from the surface of the substrate underlying the photoresist causes deleterious effects that limit the resolution of photolithographic photoresist patterning, as described below.

First, reflections cause the light to pass through the photoresist at least twice, rather than only once. In other words, light first passes through the photoresist to reach the surface of the underlying substrate. Then, light is reflected from the surface of the underlying substrate and passes back through the photoresist layer a second time. The chemical structure of the photoresist changes differently when light passes through the photoresist more than once, rather than when light passes through the photoresist only once. A portion of the light, already reflected from the surface of the underlying substrate, can also reflect again from the surface of the photoresist, passing back through the photoresist yet again. In fact, standing light waves can result in the photoresist from superpositioning of incident and reflected light rays. This overexposure problem is sometimes referred to as the "swing effect."

Even more problematic, the reflections of the light are not necessarily perpendicular. Light reflects angularly from the surface of the underlying substrate. even if the light is incident exactly perpendicular to the surface of the substrate. This results from the diffractive nature of light (i.e., light bends). Off-angle reflections reduce the sharpness of the resulting photoresist pattern. A portion of the light reflected obliquely from the surface of the underlying substrate can also be again reflected obliquely from the surface of the photoresist. As a result of such angular reflections, the light can travel well outside those photoresist regions underlying the transmissive portions of the photolithographic mask. This potentially causes photoresist exposure well outside those photoresist regions underlying transmissive portions of the photolithographic mask. This problem, which is some times referred to as "notching," results in a less sharply defined photoresist pattern that limits the density of structures formed on the integrated circuit. There is a need to overcome these photolithographic limitations to obtain the benefits of high resolution photolithography and high density integrated circuits.

SUMMARY OF THE INVENTION

The present invention provides, among other things, an antireflective coating (ARC), such as for use in integrated circuit (IC) photolithography. In one embodiment, the invention provides an antireflective structure that includes a first layer formed on the substrate. A second layer is formed on the first layer. The second layer has a working surface for receiving a photoresist layer formed thereupon. An optical impedance of the second layer, at an interface between the first and second layers, is approximately equal to an optical impedance of the first layer. The optical impedance of the second layer increases in a direction away from the interface between the first and second layers. The optical impedance at the working surface of the second layer is approximately equal to the optical impedance of at least a portion of the photoresist layer.

In another embodiment, the present invention provides, among other things, an integrated circuit. The integrated circuit includes a first layer, having a first optical impedance, formed on a substrate. A second layer, having a second optical impedance, is formed on the first layer. The second layer has a gradient optical impedance. A photoresist layer, having a photoresist optical impedance, is formed on the second layer.

In another embodiment, the present invention provides, among other things, a gradient antireflective coating for an integrated circuit. The coating includes an optically absorptive first layer formed on an integrated circuit substrate. A second layer is formed between the first layer and a photoresist layer. The second layer has an optical impedance approximately equal to an optical impedance of the first layer. The optical impedance of the second layer increases in a direction away from the interface between the first and second layers.

In another embodiment, the present invention provides, among other things, an antireflective structure that includes a first layer formed on the substrate. A second layer is formed on the first layer. The second layer has a working surface for receiving a photoresist layer formed thereupon. A composition of the second layer, at an interface between the first and second layers, is approximately equal to a composition of the first layer, at an interface between the first and second layers. The composition of the second layer changes in a direction away from the interface between the first and second layers.

Another aspect of the present invention provides a method. A first layer is formed on an integrated circuit substrate. A second layer is formed on the first layer. A composition of at least a portion of the second layer is graded in a direction away from an interface between the first and second layers. A photoresist layer is formed on the second layer. The substrate is exposed to incident light. Substantially all of the incident light that reaches the first layer is absorbed in the first layer.

In one embodiment, by way of example, but not by way of limitation, the present invention provides a method of forming an antireflective coating on a substrate. A silicon carbide first layer is formed on the substrate. A substantially continuously graded composition silicon oxycarbide second layer is formed on the first layer. A portion of the second layer that is adjacent to the first layer has a material composition that approaches that of silicon carbide.

Thus, the present invention provides, among other things, an antireflective coating (ARC), such as for use in integrated circuit photolithography. The antireflective coating is interposed between a photoresist layer and an underlying substrate. The present invention matches an optical impedance at the interface between the antireflective coating and the photoresist. The optical impedance decreases in the antireflective coating in a direction away from the interface between the antireflective coating and the photoresist. Substantially all incident light received by the antireflective coating is absorbed in the antireflective coating. As a result, substantially no light reaches the potentially highly reflective underlying substrate.

The present invention reduces swing effect and notching, thereby allowing higher resolution photolithography and resulting in higher density integrated circuits. The present invention includes embodiments that can be formed at low temperatures, making the antireflective coating particularly compatible with underlying aluminum or other metal interconnection layers, which are particularly reflective and have a low thermal budget. The present invention is also compatible with ultraviolet (UV) and deep ultraviolet (DUV) photolithographic exposure wavelengths such as required for high resolution photolithography. Unlike certain prior art approaches, which only reduce reflections, the present invention is capable of completely eliminating reflections at the interface between the photoresist and underlying antireflective coating. Unlike certain prior art approaches, which work only for particular materials on an underlying substrate, the present invention provides an antireflective coating that works for substantially all underlying substrate materials and also for substantially all overlying photoresist materials. Other advantages will also become apparent upon reading the following detailed description of the invention.

BRIEF DESCRIPTION OF THE DRAWINGS

In the drawings, like numerals describe substantially similar components throughout the several views.

DETAILED DESCRIPTION OF THE INVENTION

Figure 1:
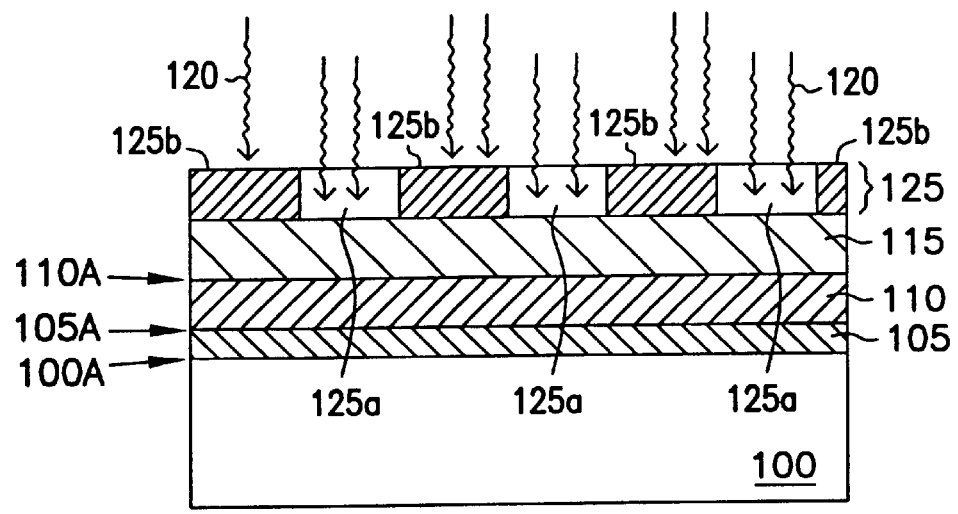
FIG. 1 is a cross-sectional view illustrating generally one embodiment of antireflective techniques according to the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention provides, among other things, an antireflective coating (ARC), such as for use in IC photolithography. The antireflective coating is interposed between a photoresist layer and an underlying substrate. One aspect of the present invention matches an optical impedance at the interface between the antireflective coating and the photoresist. The optical impedance decreases in the antireflective coating in a direction away from the interface between the antireflective coating and the photoresist. Substantially all incident light received by the antireflective coating is absorbed in the antireflective coating. As a result, substantially no light reaches the potentially highly reflective underlying substrate.

The present invention reduces swing effect and notching, thereby allowing higher resolution photolithography and higher density integrated circuits. The present invention includes embodiments that can be formed at low temperatures, making the antireflective coating particularly compatible with underlying aluminum or other metal interconnection layers, which are particularly reflective and have a low thermal budget. The present invention is also compatible with the ultraviolet (UV) and deep ultraviolet (DUV) photolithographic exposure wavelengths required for high resolution photolithography. Moreover, the present invention also includes X-ray lithography, ion-beam lithography, and other lithographic techniques. Unlike certain prior art approaches, which only reduce reflections, the present invention is capable of completely eliminating reflections at the interface between the photoresist and underlying antireflective coating. Also unlike certain prior art approaches, which work only for particular underlying substrate materials, the present invention provides an antireflective coating that works for substantially all underlying substrate materials and overlying photoresist materials. Other advantages will also become apparent upon reading the following detailed description of the invention.

FIG. 1 is a cross-sectional view illustrating generally, by way of example, but not by way of limitation, one embodiment of antireflective techniques according to the present invention. In FIG. 1, substrate 100 includes any wafer or substrate, including any topology or structures previously fabricated thereupon, such as transistors or other circuit elements, interconnection lines (e.g., aluminum, copper, refractory metals, or other conductive material), insulators for isolating circuit elements or interconnection lines, semiconductor structures, or any other integrated circuit component. First layer 105 and second layer 110 together form a backside antireflective coating (ARC), also referred to as an antireflective layer (ARL), which is interposed between substrate 100 and photoresist layer 115. First and second layers, 105 and 110, are either fabricated together in a single process step, or are alternatively separately formed during separate processing steps. Photoresist layer 115 is formed on a working surface 110A of second layer 110. Photoresist layer 115 is selectively exposed to incident light 120 using a photolithographic mask 125 overlying photoresist layer 115. Photoresist layer 115 includes a pattern of transmissive (clear) portions 125A and absorptive (opaque) portions 125B, which are characterized as transmissive or absorptive for a particular wavelength of the incident light 120.

First and second layers 105 and 110, respectively, minimize reflections of incident light 120 from substrate 100 back into photoresist layer 115. Such reflections result in reduced-definition exposure of the photoresist layer 115 (e.g., swing effect and notching), as described above. Higher density ICs require improved photolithographic resolution. Improved photolithographic resolution, in turn, requires shorter wavelengths of incident light 120 in order to limit diffractive effects. However, shorter wavelengths of incident light 120, such as ultraviolet (UV) and deep ultraviolet (DUV) wavelengths, typically result in increased reflection from the working surface 100A of underlying substrate 100 when prior art photolithographic techniques are used. Moreover, certain substrate materials, such as aluminum and other interconnection conductors, are highly reflective to incident UV and DUV light.

According to one aspect of the present invention, as described below, first and second layers 105 and 110, respectively, minimize reflection of incident light 120 back into the photoresist layer 115 from the surface 110A of second layer 110. Moreover, incident light 120 that is transmitted through second layer 110, such that it reaches first layer 105, is substantially absorbed in first layer 105. As a result, incident light 120 does not reach the surface 100A of reflective substrate 100, and is not reflected therefrom.

According to another aspect of the present invention, reflections from surface 110A of second layer 110 are minimized by matching, at surface 110A, an optical impedance $Z_{110}$ of second layer 110, to a respective optical impedance $Z_{115}$ of photoresist layer 115. A magnitude of reflection coefficient $K_{110A}$ at surface 110A is illustrated by Equation 1.

$$|K_{110A}| = \left|\frac{Z_{110} - Z_{115}}{Z_{110} + Z_{115}}\right| \quad (1)$$

In Equation 1, $K_{110A}$ is the reflection coefficient at surface 110A, $Z_{110}$ is the optical impedance of second layer 110 at surface 110A, and $Z_{115}$ is the optical impedance of photoresist layer 115 adjacent to surface 110A. According to one aspect of the invention, the optical impedance $Z_{110}$ of second layer 110 is complex-valued (i.e., having both real and imaginary parts, Z=R+j X), allowing easier matching to the optical impedance $Z_{115}$ of photoresist layer 115, which is typically also complex-valued for common photoresist layer 115 materials. As the numerator of Equation 1 indicates, better matching of $Z_{110}$ and $Z_{115}$ at surface 110A allows minimization of the magnitude of the reflection coefficient $K_{110A}$ at surface 110A. This minimizes reflections of incident light 120 at surface 110A that cause swing effect and notching.

In one example of the present invention, each of the real and imaginary parts of $Z_{110}$ and $Z_{115}$ are matched to respective real and imaginary parts of the other of $Z_{110}$ and $Z_{115}$ at surface 110A. In another example of the present invention, the magnitudes of the complex-valued optical impedances $Z_{110}$ and $Z_{115}$ are matched to each other at the surface 110A. Alternatively, only the real parts of the optical impedances $Z_{110}$ and $Z_{115}$ (i.e., the optical absorptivities) are matched to each other at surface 110A.

According to yet another aspect of the present invention, reflections from interface 105A between first layer 105 and second layer 110 are minimized by matching, at interface 105A, an optical impedance $Z_{105}$ of first layer 105 to the optical impedance $Z_{110}$ of second layer 110. A magnitude of reflection coefficient $K_{105}$ at interface 105A is illustrated by Equation 2.

$$|K_{105A}| = \left|\frac{Z_{105} - Z_{110}}{Z_{105} + Z_{110}}\right| \quad (2)$$

In Equation 2, $K_{105}$ is the reflection coefficient at interface 105A, $Z_{105}$ is the optical impedance of first layer 105 at interface 105A, and $Z_{110}$ is the optical impedance of second layer 110 at interface 105A. According to one aspect of the present invention, the optical impedance $Z_{110}$ of second layer 110 is complex-valued, as described above. According to another aspect of the present invention, the optical impedances $Z_{105}$ and $Z_{110}$ are matched at interface 105A, as described above. As the numerator of Equation 2 indicates, better matching of $Z_{105}$ and $Z_{110}$ at interface 105A minimizes the magnitude of the reflection coefficient $K_{105A}$ at interface 105A. This minimizes reflections of incident light 120 from interface 105A.

In one example of the present invention, each of the real and imaginary parts of $Z_{105}$ and $Z_{110}$ are matched to respective real and imaginary parts of the other of $Z_{105}$ and $Z_{110}$ at interface 105A. In another example of the present invention, the magnitudes of $Z_{105}$ and $Z_{110}$ are matched to each other at interface 105A. Alternatively, only the real parts of $Z_{105}$ and $Z_{110}$ (i.e., the optical absorptivities) are matched to each other at interface 105A. In a further embodiment, by way of example, but not by way of limitation, the optical impedance $Z_{110}$ (e.g., its complex value, its magnitude, or at least one of the real and imaginary parts) of second layer 110 is substantially continuously graded between the value of $Z_{110}$ at interface 105A and the value of $Z_{110}$ at surface 110A.

In one embodiment, for example, a material composition of first layer 105 includes silicon carbide (SiC), which is strongly absorptive to UV and DUV wavelengths of incident light 120. According to one aspect of this embodiment of the invention, the SiC first layer 105 is approximately stoichiometric. According to another aspect of this embodiment of the invention, the SiC first layer 105 is nonstoichiometric such as, by way of example, but not by way of limitation, having a composition approximately between $Si_{0.65}C_{0.35}$ and $Si_{0.3}C_{0.7}$.

In one embodiment, second layer 110 includes silicon oxycarbide (SiOC) having a graded material composition (also referred to as a gradient material composition). In another embodiment, by way of example, but not by way of limitation, second layer 110 includes SiOC having a substantially continuously graded material composition. For example, at interface 105A, the material composition of second layer 110 is approximately equal to the material composition of SiC first layer 105. As a result, no significant discontinuity in optical impedance exists at interface 105A, thereby substantially eliminating reflections of incident light 120 from interface 105A. Similarly, at surface 110A, the material composition of SiOC second layer 110 is selected to match an optical impedance $Z_{110}$ of second layer 110 to the optical impedance $Z_{115}$ in photoresist layer 115. Thus, between interface 105A and surface 110A, the optical impedance $Z_{110}$ is graded. In one embodiment, the gradient optical impedance $Z_{110}$ is obtained by grading the material composition of second layer 110.

As described below, a complete range of optical impedances $Z_{110}$ is obtainable in second layer 110. Moreover, the complete range of optical impedances $Z_{110}$ is repeated in second layer 110 at intervals of ¼ wavelength of the incident light 120. This enables the present invention to accurately match the optical impedance $Z_{110}$ of second layer 110 to the optical impedance $Z_{115}$ in photoresist layer 115 at interface 110A for a photoresist layer 115 of any material and optical impedance $Z_{115}$.

According to one aspect of the invention, the thickness of first layer 105 is selected such that any incident light 120 received by first layer 105 is substantially absorbed or extinguished therein. In one embodiment, for example, the present invention provides a strongly absorptive SiC first layer 105, having a thickness of greater than or equal to approximately between 100 angstroms to 200 angstroms, that substantially absorbs all of the UV or DUV incident light 120 that reaches first layer 105. This prevents any reflections from surface 100A of underlying substrate 100, which is potentially highly reflective. The exact thickness of first layer 105 varies according to, among other things, the wavelength of the incident light 120, the degree of optical absorption expected in overlying second layer 110, the degree of optical absorption expected in first layer 105, and the desired degree to which the incident light 120 is extinguished in first layer 105. For example, if a lesser degree of antireflective protection is required, then less optical absorption in first layer 105 is required, and strongly absorptive SiC first layer 105 can have a lesser thickness (e.g., 10 angstroms, 50 angstroms, etc.).

Figure 2:
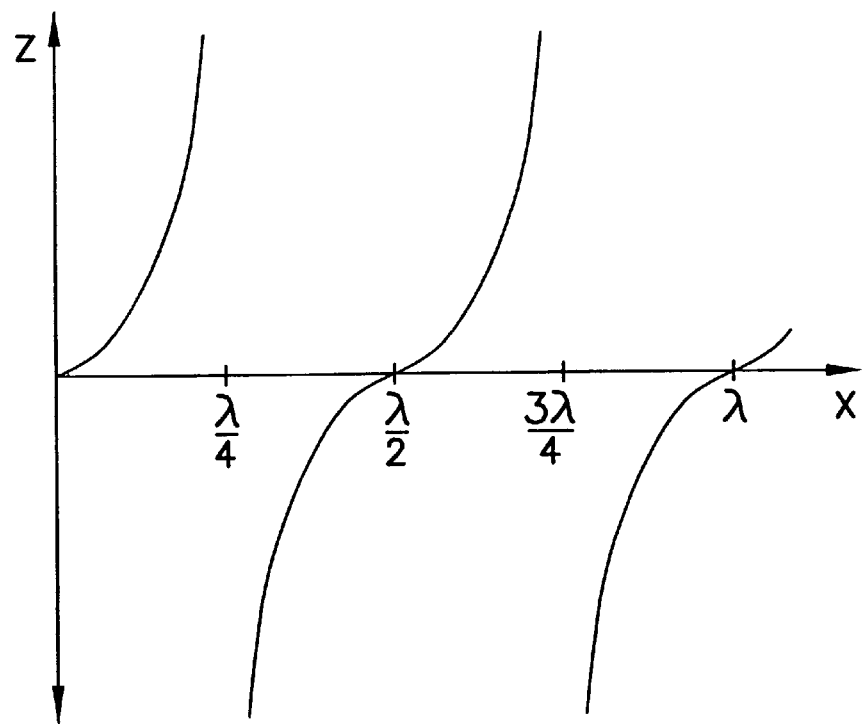
FIG. 2 is a generalized graph of optical impedance (Z) vs. distance (x), where distance x is expressed in terms of a wavelength ($\lambda$) of incident light.

According to another aspect of the invention, the thickness of second layer 110 is selected for matching optical impedance $Z_{110}$ (to $Z_{115}$ at surface 110A and to $Z_{105}$ at interface 105A), and for obtaining a desired degree of grading of the material composition of second layer 110 between surface 110A and interface 105A. In one embodiment, for example, the thickness of second layer 110 is less than or equal to ¼ of the wavelength of the incident light 120, since a complete range of optical impedances $Z_{110}$ is obtainable within that distance. Moreover, sign-changes in the optical impedance $Z_{110}$ exist at ¼ wavelength intervals, and discontinuities in the optical impedance $Z_{110}$ exist at ½ wavelength intervals, as illustrated in FIG. 2, which is a generalized graph of optical impedance (Z) vs. distance (x), where distance (x) is expressed in terms of the wavelength (λ) of the incident light 120.

Another embodiment of the present invention, however, uses a thickness of second layer 110 that exceeds ¼ wavelength of the incident light 120 such as, for example, if process constraints make it difficult to obtain the desired compositional rate of change of SiOC second layer 110 within a distance of ¼ wavelength of the incident light 120. Since a complete range of magnitudes of optical impedances $Z_{110}$ is available in each ¼ wavelength interval, the thickness of second layer 110 can also exceed ¼ wavelength of incident light 120, as seen in FIG. 2, while still providing the desired impedance matching properties at each of interface 105A and surface 110A.

In an alternative embodiment, for example, first layer 105 includes polycrystalline silicon (Si), which is also strongly absorptive to UV and DUV wavelengths of incident light 120. In this embodiment, second layer 110 includes silicon oxycarbide having a graded material composition, such as a substantially continuously graded SiOC material composition. At interface 105A, the material composition of second layer 110 is approximately equal to the material composition of polycrystalline Si first layer 105. As a result, no significant discontinuity in optical impedance exists at interface 105A, thereby substantially eliminating reflections of incident light 120 from interface 105A. Similarly, at surface 110A, the material composition of SiOC second layer 110 is selected to match an optical impedance $Z_{110}$ of second layer 110 to the optical impedance $Z_{115}$ of photoresist layer 115, as described above. According to another aspect of the invention, the material composition of SiOC second layer 110 is graded (e.g., substantially continuously) from that of polycrystalline Si, at interface 105A, to the above-described desired SiOC composition at surface 110A.

Though the above examples illustrate particular material compositions of each of first layer 105 and second layer 110, the present invention is understood to include, among other things, the use of any materials providing a strongly absorptive or low optical impedance first layer 105 and substantially continuously graded second layer 110 material composition or optical impedance $Z_{110}$. Moreover, first layer 105 and second layer 110 can be formed together, in a single process step, or separately, in more than one process step.

Process

According to one aspect of the invention, first layer 105 includes amorphous or polycrystalline silicon (Si) formed by chemical vapor deposition (CVD). According to another aspect of the invention, first layer 105 includes stoichiometric or nonstoichiometric silicon carbide (SiC). One embodiment of forming SiC first layer 105 is described in the Forbes et al. U.S. patent application Ser. No. 08/903,486, entitled "SILICON CARBIDE GATE TRANSISTOR AND FABRICATION PROCESS", filed on Jul. 29, 1997, which disclosure is assigned to the assignee of the present patent application, and which disclosure is incorporated herein by reference.

In one embodiment, for example, SiC first layer 105 is deposited using low-pressure chemical vapor deposition (LPCVD). The LPCVD process uses either a hot-wall reactor or a cold-wall reactor with a reactive gas, such as a mixture of $Si(CH_3)_4$ and Ar. Examples of such processes are disclosed in an article by Y. Yamaguchi et al., entitled "Properties of Heteroepitaxial 3C—SiC Films Grown by LPCVD", in the 8*th International Conference on Solid-State Sensors and Actuators and Eurosensors IX, Digest of Technical Papers*, page 3. vol. (934+1030+85), pages 190–3, Vol. 2, 1995, and in an article by M. Andrieux, et al., entitled "Interface and Adhesion of PECVD SiC Based Films on Metals", in supplement *Le Vide Science, Technique et Appli-* cations. (France), No. 279, pages 212–214, 1996. However, SiC first layer 105 can also be deposited using other techniques such as, for example, enhanced CVD techniques including low pressure rapid thermal chemical vapor deposition (LP-RTCVD), or by decomposition of hexamethyl disalene using ArF excimer laser irradiation, or by low temperature molecular beam epitaxy (MBE). Other examples of forming SiC first layer 105 include reactive magnetron sputtering, DC plasma discharge, ion-beam assisted deposition, ion-beam synthesis of amorphous SiC films, laser crystallization of amorphous SiC, laser reactive ablation deposition, and epitaxial growth by vacuum anneal.

In another embodiment, SiC first layer 105 is formed by plasma-assisted CVD using silane and methane. See e.g., M. M. Rahman et al., "Preparation and Electrical Properties of An Amorphous SiC/Crystalline Si p$^+$n Heterostructure," Jpn. J. Appl. Phys., Vol. 26, pp. 515–524, (1984), which disclosure is incorporated herein by reference. For example, substrate 100 is heated to a temperature of approximately 250 degrees Celsius. Silane ($SiH_4$) and methane ($CH_4$) gases are introduced in the presence of an RF (13.56 MHz) plasma at a power that is approximately between 10 Watts and 100 Watts. At an RF power of approximately 10 Watts, SiC first layer 105 is formed at a film deposition rate that ranges approximately between 12 angstroms per minute and 180 angstroms per minute when the silane and methane gases are provided at pressures that range approximately from 0.1 Torr. to 0.6 Torr. The exact material composition of the SiC first layer 105 is fine tuned by varying the RF power at a particular gas pressure. In one embodiment, for example, a gas pressure of 0.4 Torr and RF plasma power of approximately 20 Watts forms an SiC first layer 105 having a material composition of approximately $Si_{0.65}C_{0.35}$. In another embodiment, for example, a gas pressure of 0.4 Torr and an RF plasma power of approximately 100 Watts forms an SiC first layer 105 having a material composition of approximately $Si_{0.3}C_{0.7}$. The resulting SiC first layer 105 has a thickness that is approximately between 100 angstroms and 200 angstroms.

According to another aspect of the invention, second layer 110 includes silicon oxycarbide (SiOC) having a graded material composition, such as a substantially continuously graded SiOC material composition. In one embodiment, by way of example, but not by way of limitation, SiOC second layer 110 is formed by high temperature deposition, such as by pyrolysis of silicone polymer resins. See e.g., G. M. Renlund et al., "Silicon Oxycarbide Glasses. I. Preparation and Chemistry," J. Materials Research, Vol. 6, No. 12, pp. 2716–22, December 1991. Starting polymers include methyl trichlorosilane and dimethyl dichlorosilane. Heating substrate 100 to a temperature of approximately between 700 degrees Celsius and 1000 degrees Celsius produces resulting amorphous SiOC second layer 110. SiOC second layer 110 remains amorphous at temperatures below approximately 1500 degrees Celsius, above which it tends to become crystalline SiC.

In another embodiment, by way of example, but not by way of limitation, SiOC second layer 110 is formed by pyrolytic conversion of poly-silsesquioxane copolymers. The silsesquioxane copolymers have varying ratios of phenyl to methyl groups, such as by synthesis through hydrolysis and condensation of phenyltrimethoxysilanes and methyltrimethoxysilanes. The ratio of phenyl to methyl groups controls the resulting material composition of the SiOC second layer 110. The SiOC second layer 110 is formed by pyrolysis at temperatures approximately between 1000 degrees Celsius and 1200 degrees Celsius. Heating beyond 1200 degrees Celsius diminishes the SiOC structure, and the material becomes primarily amorphous silica, amorphous SiC, some small crystallites of SiC, and graphitic carbon.

In another embodiment, by way of example, but not by way of limitation, SiOC second layer 110 is formed at low temperatures. This is particularly useful for forming an antireflective coating over a substrate 100 that includes low thermal budget layers such as, for example, aluminum or other metallization layers. Such layers cannot withstand subsequent high temperature processing steps. SiOC second layer 110 is formed by plasma-assisted CVD. Substrate 100 is heated to a temperature of approximately 100 degrees Celsius. A mixture of silane and methane gases, to which oxygen or nitrous oxide ($N_2O$) is added, is introduced in the presence of an RF (13.56 MHz) plasma at a power of approximately 120 Watts.

According to one aspect of the invention, the composition of the SiOC second layer 110 is changed by varying the ratio of nitrous oxide to methane during formation of second layer 110. This provides a graded material composition SiOC second layer 110. Continuously varying the ratio of nitrous oxide to methane during formation of second layer 110 provides a substantially continuously graded SiOC material composition of second layer 110.

By increasing the ratio of nitrous oxide to methane, the SiOC composition contains more oxygen and less carbon. Thus, in one embodiment, the composition of SiOC second layer 110 is varied substantially continuously from SiC to $SiO_2$ by initially providing only silane and methane. Then, nitrous oxide is added to the silane and methane, in an increasing nitrous oxide to methane ratio. Finally, only silane and nitrous oxide is provided, in one embodiment. In other embodiments, the exact final ratio of the silane, methane, and nitrous oxide constituent gases depends on the particular desired composition of SiOC second layer 110 at surface 110A, as described above.

According to another aspect of the invention, the composition of the SiOC second layer 110 is changed by varying the ratio of nitrous oxide to silane, such as to obtain a substantially continuously graded composition SiOC second layer 110. By increasing the ratio of nitrous oxide to silane, the SiOC composition contains more oxygen and less silicon. Thus, in one embodiment, the composition of SiOC second layer 110 is varied substantially continuously from Si to SiOC by initially providing only silane. Then, nitrous oxide and methane are added to the silane, in an increasing ratio of nitrous oxide and methane to silane. The exact final ratio of the silane, methane, and nitrous oxide constituent gases depends on the particular desired composition of SiOC second layer 110 at surface 110A.

Conclusion

As described above, the present invention provides, among other things, an antireflective coating (ARC), such as for use in integrated circuit photolithography. The antireflective coating is interposed between a photoresist layer and an underlying substrate. One aspect of the present invention matches an optical impedance at the interface between the antireflective coating and the photoresist. The optical impedance decreases in the antireflective coating in a direction away from the interface between the antireflective coating and the photoresist. Substantially all incident light is that reaches the antireflective coating is absorbed in the antireflective coating. As a result, substantially no light reaches the potentially highly reflective underlying substrate.

The present invention reduces swing effect and notching, thereby allowing higher resolution photolithography and higher density integrated circuits. The present invention includes embodiments that can be formed at low temperatures, making the antireflective coating particularly compatible with underlying aluminum or metal interconnection layers, which are particularly reflective and have a low thermal budget. The present invention is also compatible with the ultraviolet (UV) and deep ultraviolet (DUV) photolithographic exposure wavelengths required for high resolution photolithography. Unlike certain prior art approaches, which only reduce reflections, the present invention is capable of completely eliminating reflections at the interface between the photoresist and underlying antireflective coating. Unlike certain prior art approaches, which work only for particular materials on an underlying substrate, the present invention provides an antireflective coating that works for substantially all underlying substrate materials and overlying photoresist materials. Other advantages are also described in the above detailed description of the invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit, comprising:
   a first layer formed on a substrate and having a first optical impedance;
   a second layer formed on the first layer and having a gradient optical impedance; and
   a photoresist layer formed on the second layer and having a photoresist optical impedance.

2. The integrated circuit of claim 1, wherein the gradient optical impedance has a second optical impedance which is approximately equal to the first optical impedance at an interface between the first and second layers, and which increases in a direction away from the interface between the first and second layers.

3. The integrated circuit of claim 1, wherein the gradient optical impedance has a third optical impedance which is approximately equal to photoresist optical impedance at an interface between the second and photoresist layers.

4. A gradient antireflective coating for an integrated circuit, the coating comprising:
   an optically absorptive first layer formed on an integrated circuit substrate; and
   a second layer formed between the first layer and a photoresist layer, the second layer having an optical impedance approximately equal to an optical impedance of the first layer, and the optical impedance of the second layer increases in a direction away from the interface between the first and second layers.

5. An antireflective structure for lithography of an integrated circuit substrate using incident light having a wavelength, the antireflective structure comprising:
   a first layer formed on the substrate;
   a second layer formed on the first layer and having a working surface for receiving a photoresist layer formed thereupon; and
   wherein an optical impedance of the second layer, at an interface between the first and second layers, is approximately equal to an optical impedance of the first layer, and the optical impedance of the second layer increases in a direction away from the interface between the first and second layers and, at the working surface of the second layer, the optical impedance of the second layer is approximately equal to the optical impedance of the photoresist layer.

6. The structure of claim 5, in which the optical impedance of the second layer increases substantially continuously in a direction away from the interface between the first and second layers.

7. The structure of claim 5, in which the optical impedances of each of the first and second layers is a complex impedance that is substantially matched to the complex impedance of the other of the first and second layers at the interface between the first and second layer, and the optical impedance of the photoresist layer is a complex impedance that is substantially matched to the complex impedance of the second layer at the working surface of the second layer.

8. The structure of claim 7, in which the magnitude of the complex impedance of each of the first and second layers is substantially matched at the interface between the first and second layers.

9. The structure of claim 7, in which the magnitude of the complex impedance of each of the second and photoresist layers is substantially matched at the working surface of the second layer.

10. The structure of claim 7, in which a real part of the complex impedance of the each of the first and second layers is substantially matched at the interface between the first and second layers.

11. The structure of claim 7, in which a real part of the complex impedance of each of the second and photoresist layers is substantially matched at the working surface of the second layer.

12. The structure of claim 5, in which a composition of the second layer changes in a direction away from the interface between the first and second layers.

13. The structure of claim 5, in which the second layer includes silicon oxycarbide.

14. The structure of claim 13, in which a composition of the silicon oxycarbide changes in a direction away from the interface between the first and second layers.

15. The structure of claim 14, in which the composition of the silicon oxycarbide is graded to include more oxygen and less carbon in a direction away from the interface between the first and second layers.

16. The structure of claim 15, in which the first layer includes silicon carbide, and the composition of the silicon oxycarbide second layer approaches that of silicon carbide at the interface between the first and second layers.

17. The structure of claim 13, in which the composition of the silicon oxycarbide is graded to include more oxygen and less silicon in a direction away from the interface between the first and second layers.

18. The structure of claim 17, in which the first layer includes silicon, and the composition of the silicon oxycarbide approaches that of silicon at the interface between the first and second layers.

19. The structure of claim 5, in which a thickness of the second layer is less than or equal to approximately ¼ of the wavelength of the incident light.

20. The structure of claim 5, in which a thickness of the second layer is less than or equal to approximately 425 angstroms.

21. The structure of claim 5, in which a thickness of the first layer is greater than or equal to a thickness that absorbs substantially all of the incident light received by the first layer.

22. The structure of claim 5, in which a thickness of the first layer is approximately between 100 angstroms and 200 angstroms.

23. The structure of claim 5, in which an optical impedance of the working surface of the second layer is approximately equal to an optical impedance of the photoresist.

24. The structure of claim 5, in which the first layer is substantially completely absorptive to the incident light.

25. The structure of claim 24, in which the wavelength of the incident light is ultraviolet or deep ultraviolet.

26. The structure of claim 25, in which the wavelength of the incident light is selected from one of approximately 193 nanometers and approximately 248 nanometers.

27. An antireflective structure for lithography of an integrated circuit substrate using incident light having a wavelength, the antireflective structure comprising:
   a first layer formed on the substrate;
   a second layer formed on the first layer and having a working surface for receiving a photoresist layer formed thereupon; and
   wherein an optical absorptivity by the second layer, at an interface between the first and second layers, is approximately equal to an optical absorptivity by the first layer, and the optical absorptivity by the second layer decreases substantially continuously in a direction away from the interface between the first and second layers, and the optical absorptivity at the working surface of the second layer is approximately equal to the optical absorptivity of at least a portion of the photoresist layer.

28. An antireflective structure for lithography of an integrated circuit substrate using incident light having a wavelength, the antireflective structure comprising:
   a first layer formed on the substrate;
   a second layer formed on the first layer and having a working surface for receiving a photoresist layer formed thereupon; and
   wherein a composition of the second layer, at an interface between the first and second layers, is approximately equal to a composition of the first layer, at an interface between the first and second layers, and the composition of the second layer changes substantially continuously in a direction away from the interface between the first and second layers.

29. The structure of claim 28, in which an optical impedance at the working surface of the second layer is approximately equal to an optical impedance of the photoresist layer adjacent to the working surface of the second layer.

30. The structure of claim 28, in which the second layer includes silicon oxycarbide.

31. The structure of claim 30, in which the composition of the silicon oxycarbide is graded to include more oxygen and less carbon in a direction away from the interface between the first and second layers.

32. The structure of claim 31, in which the first layer includes silicon carbide, and the composition of the silicon oxycarbide second layer approaches that of silicon carbide at the interface between the first and second layers.

33. The structure of claim 30, in which the composition of the silicon oxycarbide is graded to include more oxygen and less silicon in a direction away from the interface between the first and second layers.

34. The structure of claim 33, in which the first layer includes silicon, and composition of the silicon oxycarbide approaches that of silicon at the interface between the first and second layers.

35. The structure of claim 28, in which a thickness of the second layer is less than or equal to approximately ¼ of the wavelength of the incident light.

36. The structure of claim 28, in which a thickness of the second layer is less than or equal to approximately 425 angstroms.

37. The structure of claim 28, in which a thickness of the first layer is greater than or equal to a thickness that absorbs substantially all of the incident light received by the first layer.

38. The structure of claim 28, in which a thickness of the first layer is approximately between 100 angstroms and 200 angstroms.

39. The structure of claim 28, in which the first layer is substantially completely absorptive to the incident light.

40. The structure of claim 39, in which the wavelength of the incident light is ultraviolet or deep ultraviolet.

41. The structure of claim 40, in which the wavelength of the incident light is selected from one of approximately 193 nanometers and approximately 248 nanometers.

* * * * *

UNITED STATES PATENT AND TRADEMARK OFFICE
CERTIFICATE OF CORRECTION

PATENT NO. : 6,297,521 B1
DATED : October 2, 2001
INVENTOR(S) : Forbes et al.

It is certified that error appears in the above-identified patent and that said Letters Patent is hereby corrected as shown below:

Column 1,
Line 9, after "reference." insert -- This application is related to co-pending, commonly assigned patent application of Forbes et al., U.S. patent application serial number 08/903,486 entitled "SILICON CARBIDE GATE TRANSISTOR AND FABRICATION PROCESS" filed on July 27, 1997, which disclosure is incorporated herein by reference. --.

Column 8,
Line 15, after "oxycarbide" insert -- (SiOC) --.

Signed and Sealed this

Twentieth Day of August, 2002

*Attest:*

JAMES E. ROGAN
*Attesting Officer*  *Director of the United States Patent and Trademark Office*